(12) United States Patent
Shue et al.

(10) Patent No.: US 6,417,569 B1
(45) Date of Patent: Jul. 9, 2002

(54) FLUORINE-DOPED SILICATE GLASS HARD MASK TO IMPROVE METAL LINE ETCHING PROFILE

(75) Inventors: Shau-Lin Shue, Hsinchu; Chia-Shiung Tsai, Hsin-Chu, both of (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 0 days.

(21) Appl. No.: 09/378,499

(22) Filed: Aug. 20, 1999

Related U.S. Application Data

(62) Division of application No. 08/988,673, filed on Dec. 29, 1997, now Pat. No. 5,962,346.

(51) Int. Cl.$^7$ .......................... H01L 23/48; H01L 23/52; H01L 29/40
(52) U.S. Cl. ........................................ 257/758; 257/765
(58) Field of Search ................................ 257/758, 767, 257/760, 765

(56) References Cited

U.S. PATENT DOCUMENTS

| | | | |
|---|---|---|---|
| 5,350,484 A | 9/1994 | Gardner et al. | 156/628 |
| 5,369,053 A | 11/1994 | Fang | 437/194 |
| 5,460,693 A | 10/1995 | Moslehi | 156/662.1 |
| 5,591,676 A | 1/1997 | Hughes et al. | 437/195 |
| 5,864,179 A * | 1/1999 | Koyama | 257/767 |
| 6,080,529 A * | 6/2000 | Ye et al. | 430/318 |

FOREIGN PATENT DOCUMENTS

JP 08-203911-a * 8/1996

OTHER PUBLICATIONS

US 5,665,341, 09/1997, Shen et al. (withdrawn)*

* cited by examiner

Primary Examiner—Phat X. Cao
(74) Attorney, Agent, or Firm—George O. Saile; Stephen B. Ackerman; Rosemary L. S. Pike

(57) ABSTRACT

A new method of etching metal lines using fluorine-doped silicate glass as a hard mask is described. Semiconductor device structures are provided in and on a semiconductor substrate. The semiconductor device structures are covered with an insulating layer. A metal layer is deposited overlying the insulating layer. A layer of fluorine-doped silicate glass is deposited overlying the metal layer wherein the fluorine-doped silicate glass layer acts as a hard mask. The hard mask is covered with a layer of photoresist. The photoresist layer is exposed to actinic light and developed and patterned to form the desired photoresist mask. The hard mask is etched away where it is not covered by the photoresist mask leaving a patterned hard mask. The metal layer not covered by the patterned hard mask is etched away to form metal lines whereby fluorine ions released from the patterned hard mask form a passivation layer on the sidewalls of the metal lines thereby preventing undercutting of the metal lines resulting in metal lines having a vertical profile. The photoresist mask is removed and fabrication of the integrated circuit is completed.

6 Claims, 5 Drawing Sheets

FLUORINE-DOPED SILICATE GLASS HARD MASK TO IMPROVE METAL LINE ETCHING PROFILE

This is a division of patent application Ser. No. 08/988,673, filing date Dec. 29, 1997, now U.S. Pat. No. 5,862,346 Fluorine-Doped Silicate Glass Hard Mask To Improve Metal Line Etching Profile, assigned to the same assignee as the present invention.

BACKGROUND OF THE INVENTION (1) Field of the Invention

The invention relates to a method of photolithographic etching of metal lines, and more particularly, to a method of photolithographic etching of sub-quarter micron metal lines without undercutting in the manufacture of integrated circuits.

(2) Description of the Prior Art

It is desired for metal lines to have a vertical profile. This is not always easy to achieve, especially for sub-quarter micron metal lines. FIG. 1 illustrates in cross-sectional representation a partially completed integrated circuit device. Semiconductor substrate 40 contains semiconductor devices structures, not shown. A metal line stack is shown on the substrate. Barrier metal layer 44 (for example, titanium/titanium nitride) is on the bottom of the stack. The metal layer 46, such as AlCu, overlies the barrier layer. An antireflective coating (ARC) 48 is at the top of the stack. Photoresist mask 50 is used in etching the metal line.

In order to improve lithographic resolution in the formation of sub-quarter micron metal lines, the photoresist layer must become thinner. However, if the photoresist layer is too thin, the top corner 52 of the metal line may be damaged during the etching of a high aspect ratio metal line. Therefore, it is necessary to use a hard mask during metal etching in sub-quarter micron technology to protect the metal top corners without using a thicker photoresist mask.

FIG. 2 illustrates a partially completed integrated circuit device as in FIG. 1 except that an oxide hard mask 49 has been formed overlying the ARC layer. Conventionally, the etchant gases are $BCl_3$, $Cl_2$, and $N_2$. These gases have been found to be insufficient in producing a passivation layer on the sidewalls of the AlCu lines which would prevent $Cl_2$ erosion and undercutting during etching. The undercutting 53 is illustrated in FIG. 2.

One proposed solution to the undercutting problem is the use of $SF_6$ gas in the overetch step to react with titanium from the barrier layer and AlCu to form $AlF_x$ or $TiF_x$ as a passivation layer. However, $SF_6$ is also the etching gas used in the tungsten etchback process. Tungsten plugs are likely to underlie the metal lines in the substrate, as illustrated in FIG. 3. Especially at the endcap of the metal line, as shown in FIG. 3, the $SF_6$ etchant gas will damage the integrity of the tungsten plug 54.

U.S. Pat. No. 5,460,693 to Moslehi uses a fluorinated layer as a mask instead of photoresist. An oxide is formed on the unexposed areas of the fluorinated layer to form a hard oxide mask. U.S. Pat. No. 5,591,676 to Hughes et al teaches etching a fluorinated polymer using a hard oxide mask. U.S. Pat. No. 5,369,053 to Fang teaches using an oxide hard mask under a thin photoresist layer and etching the underlying metal using both a fluorine-based etchant and a chlorine-based etchant. U.S. Pat. No. 5,350,484 to Gardner et al teaches a method of implanting ions into an exposed area of metal and then selectively removing the implanted metal.

SUMMARY OF THE INVENTION

A principal object of the present invention is to provide an effective and very manufacturable method of etching metal lines.

Another object of the present invention is to provide a method of etching metal lines without undercutting of the metal lines.

A further object of the present invention is to provide a method of etching metal lines having a vertical etching profile.

Yet another object of the present invention is to provide a method of etching metal lines wherein the integrity of an underlying tungsten plug is preserved.

A still further object of the present invention is to provide a method of etching metal lines using fluorine-doped silicate glass as a hard mask.

In accordance with the objects of this invention a new method of etching metal lines using fluorine-doped silicate glass as a hard mask is achieved. Semiconductor device structures are provided in and on a semiconductor substrate. The semiconductor device structures are covered with an insulating layer. A metal layer is deposited overlying the insulating layer. A layer of fluorine-doped silicate glass is deposited overlying the metal layer wherein the fluorine-doped silicate glass layer acts as a hard mask. The hard mask is covered with a layer of photoresist. The photoresist layer is exposed to actinic light and developed and patterned to form the desired photoresist mask. The hard mask is etched away where it is not covered by the photoresist mask leaving a patterned hard mask. The metal layer not covered by the patterned hard mask is etched away to form metal lines whereby fluorine ions released from the patterned hard mask form a passivation layer on the sidewalls of the metal lines thereby preventing undercutting of the metal lines resulting in metal lines having a vertical profile. The photoresist mask is removed and fabrication of the integrated circuit is completed.

Also in accordance with the objects of the invention, an integrated circuit device having a fluorine-doped silicate glass hard mask is achieved. Semiconductor device structures lie in and on a semiconductor substrate having an insulating layer thereover. A tungsten plug extends through the insulating layer to contact one of the semiconductor device structures. A metal line stack overlies the tungsten plug wherein the metal line stack comprises a barrier layer contacting the tungsten plug, a metal layer overlying the barrier layer, an antireflective coating layer overlying the metal layer, and a fluorine-doped silicate glass hard mask overlying the antireflective coating layer. A passivation layer overlies the metal line stack to complete the integrated circuit device.

BRIEF DESCRIPTION OF THE DRAWINGS

In the accompanying drawings forming a material part of this description, there is shown.

DESCRIPTION OF THE PREFERRED EMBODIMENTS

Figure 1:
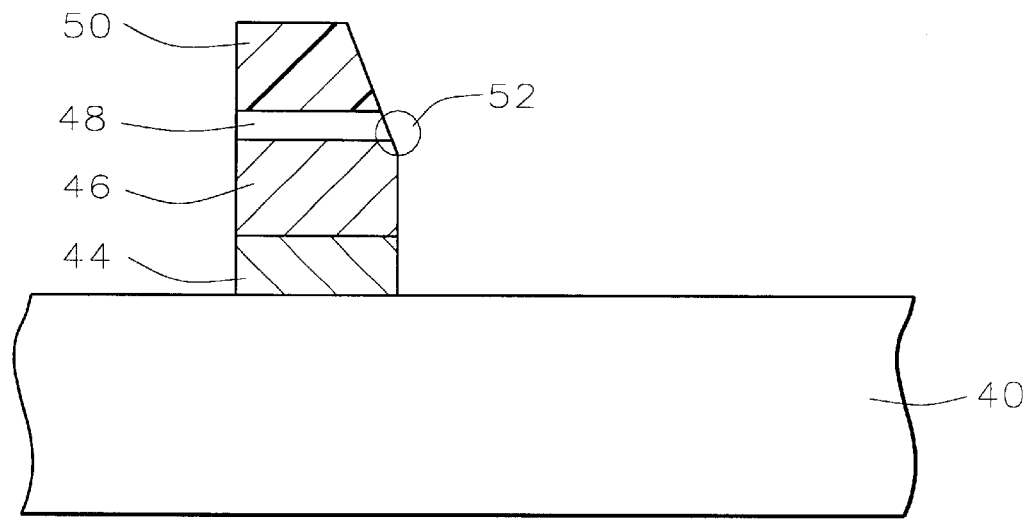
FIGS. 1 through 3 schematically illustrate in cross-sectional representation etching problems of the prior art.
Figure 2:
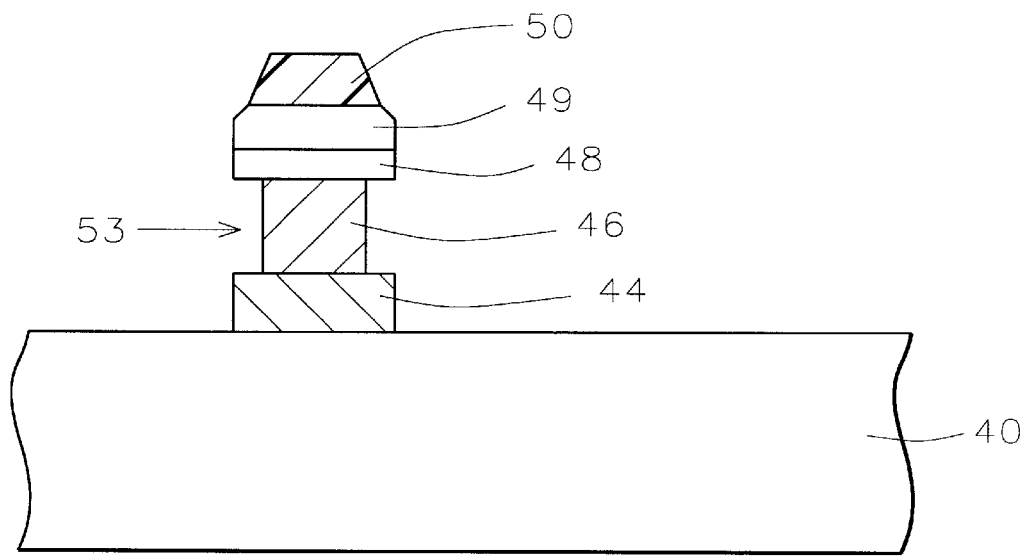
Figure 3:
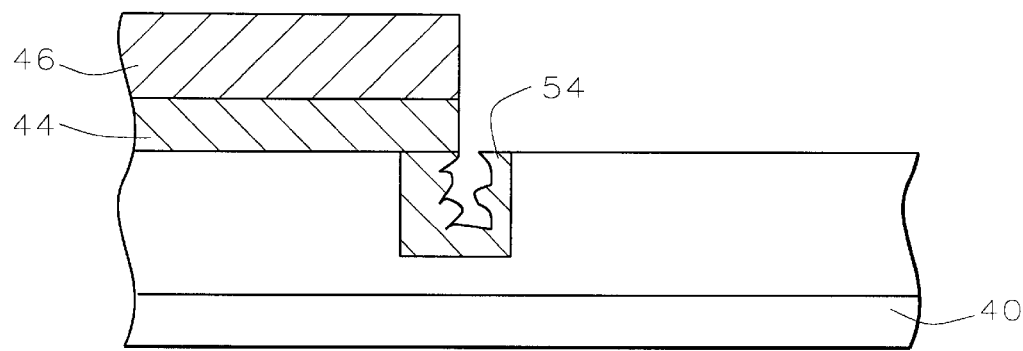
Figure 4:
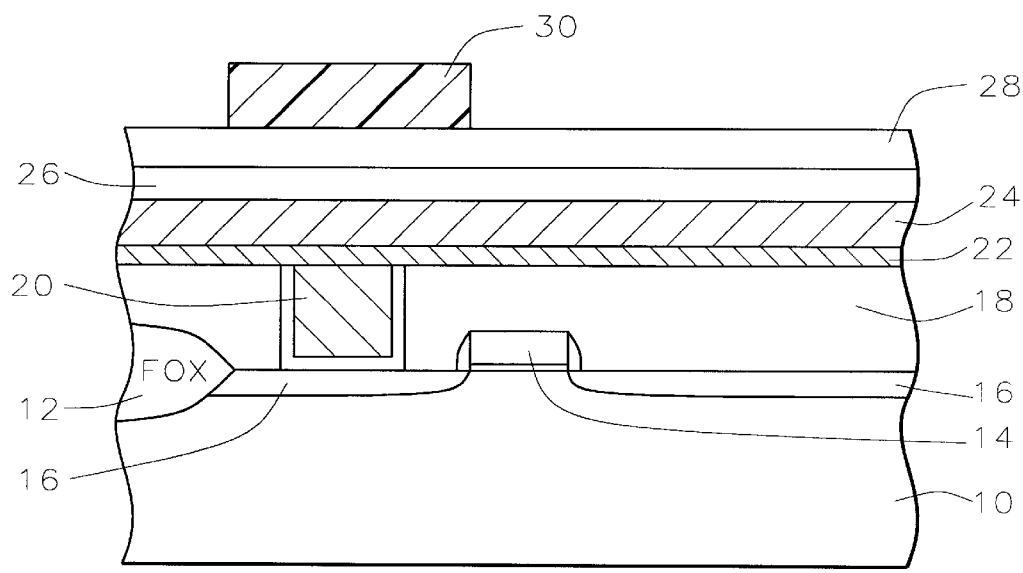
FIGS. 4 through 9 schematically illustrate in cross-sectional representation a preferred embodiment of the present invention.

Referring now more particularly to FIG. 4, there is illustrated a portion of a partially completed integrated circuit. Semiconductor substrate 10 is preferably composed of monocrystalline silicon. Field oxide regions 12 have been formed as is conventional in the art in the semiconductor substrate 10. Semiconductor device structures, including gate electrode 14 and source and drain regions 16, are fabricated in and on the semiconductor substrate. A thick insulating layer of silicon dioxide or borophosphosilicate glass (BPSG), or the like, 18 is blanket deposited over the semiconductor device structures. A tungsten plug 20 may be formed as is conventional in the art.

Next, a barrier layer 22 is deposited over the insulating layer. This may be titanium and titanium nitride with a combined thickness of between about 500 and 1500 Angstroms.

The metal layer 24 is deposited over the barrier layer 22. The metal layer comprises aluminum or an aluminum alloy such as AlCu and is deposited by physical vapor deposition to a thickness of between about 4000 and 9000 Angstroms. An antireflective coating 26, such as titanium, nitride, or oxynitride, is deposited over the metal layer 24.

Next, the hard mask of the present invention is formed. A layer of fluorine-doped silicate glass (FSG) is deposited over the ARC by chemical vapor deposition (CVD) using $SiH_4$, $SiF_4$, and $SiF_2H_2$ or $SiH_2Cl_2$ gases. This FSG layer 28 has a thickness of between about 200 and 1200 Angstroms.

A layer of photoresist is coated over the hard mask 28 and is exposed and developed to form the photoresist mask 30. In the process of the present invention, the photoresist layer has a thickness of between about 0.3 and 1.5 microns. Conventionally, the photoresist mask must be as thick as between about 0.5 and 1.5 microns. The thinner photoresist layer of the present invention does not cause depth of focus problems during photolithography to form the photoresist mask. Using deep ultraviolet (DUV) photolithography instead of conventional i-line photolithography allows the use of a thinner photoresist layer. This thinner photoresist mask is essential for sub-quarter micron technology.

Figure 5:
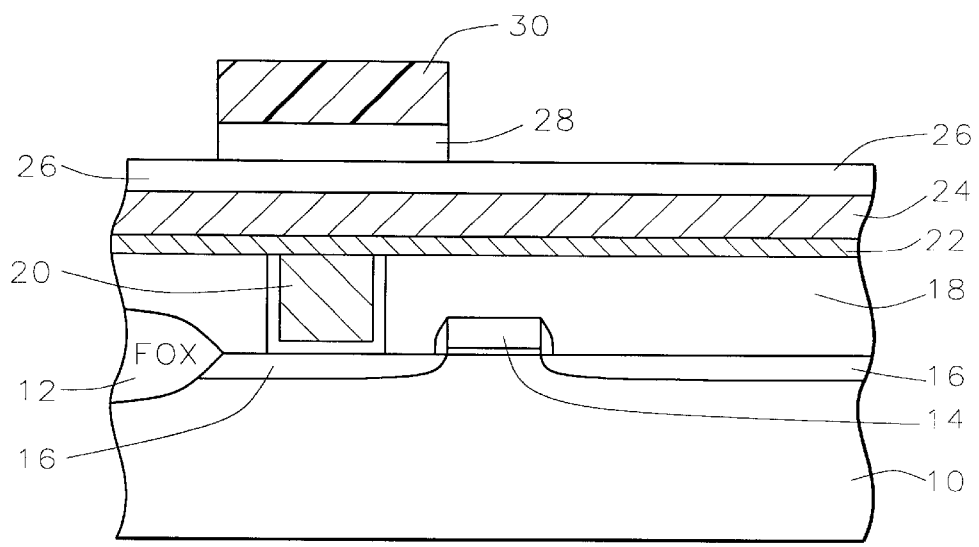

The FSG hard mask 28 layer is etched away where it is not covered by the photoresist mask 30, as illustrated in FIG. 5. The etching may be performed using, for example, $C_xF_y$. chemistry.

Figure 6:
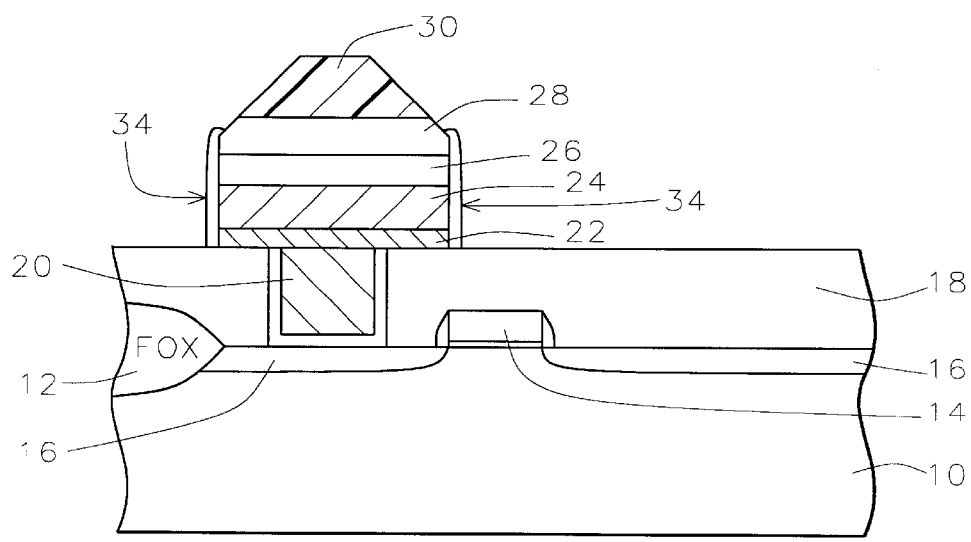

Now, the metal line stack is to be etched away where it is not covered by the hard mask, as illustrated in FIG. 6, using $BCl_3$, $Cl_2$, and $N_2$ chemistry, for example. During the metal etching, fluorine ions from the hard mask 28 are shed and form a $C_xF_y$ polymer passivation layer 34 on the sides of the metal line stack, especially on the sidewalls of the aluminum and barrier metal layers 24 and 22. This passivation layer 34 prevents undercutting of the metal layer. The FSG hard mask 28 prevents damage to the corner of the metal line.

Figure 7:
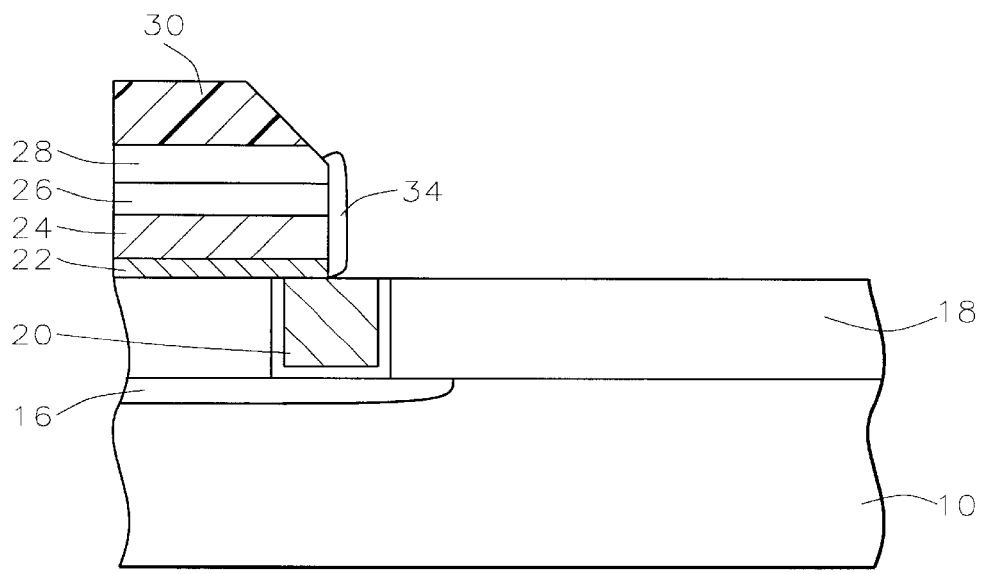

FIG. 7 illustrates a different portion of the partially completed integrated circuit device. Here, the endcap of the metal line 24 is shown. The passivation layer 34 protects the sidewall of the metal line from undercutting. Since $SF_6$ gas is not used in the etching of the metal line, the tungsten plug 20 is not harmed during etching. The FSG hard mask 28 prevents damage to the corner of the metal line.

Now, the photoresist mask 30 is removed. The FSG hard mask 28, ARC layer 26, and sidewall polymer 34 can be removed as is conventional in the art, but it is not necessary to remove these layers.

Figure 8:
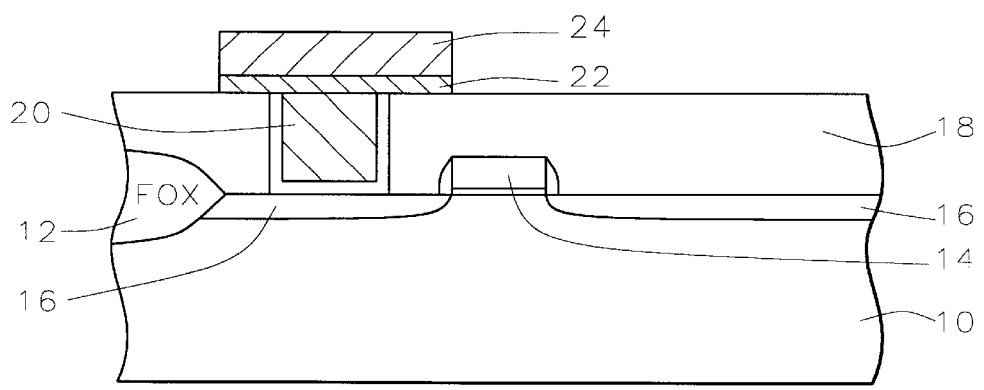
Figure 9:
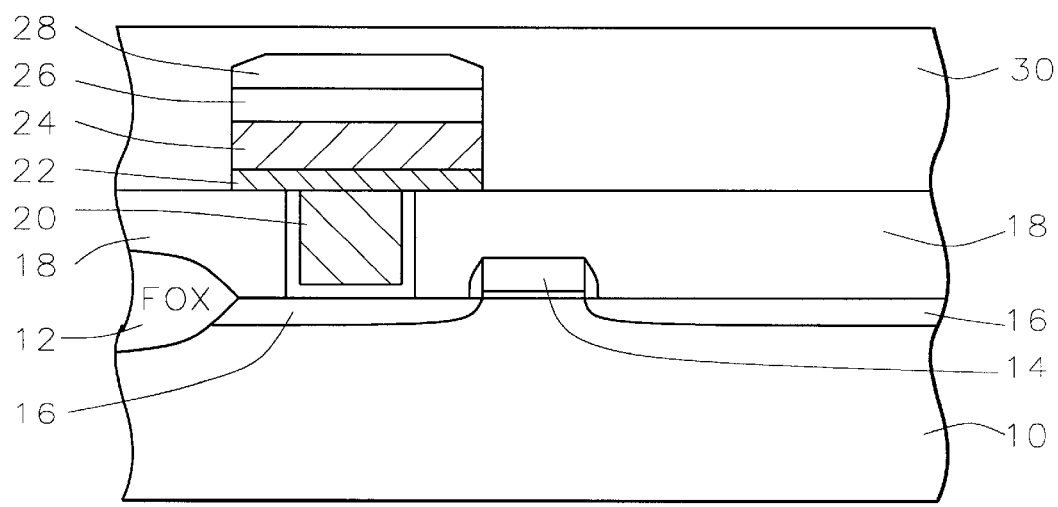

FIG. 8 shows the completed metal line 24 having a vertical profile. FIG. 9 also shows the completed metal line 24 having a vertical profile , but with the ARC and the FSG hard mask layers remaining on the metal lines stack.

FIG. 9 illustrates the integrated circuit device of the present invention having a fluorine-doped silicate glass hard mask. Semiconductor device structures, such as gate electrode 14 and source and drain regions 16 lie in and on a semiconductor substrate 10 having an insulating layer 18 thereover. A tungsten plug 20 extends through the insulating layer 18 to contact one of the semiconductor device structures, such as source/drain region 16. A metal line stack overlies the tungsten plug 20 wherein the metal line stack comprises a barrier layer 22 contacting the tungsten plug, a metal layer 24 overlying the barrier layer, an antireflective coating layer 26 overlying the metal layer, and a fluorine-doped silicate glass hard mask 28 overlying the antireflective coating layer. A passivation layer 30 overlies the metal line stack to complete the integrated circuit device.

The process of the invention uses a fluorinedoped silicate glass hard mask to protect the top corners of the metal line. The hard mask also provides a fluorine source to form the passivation layer which protects the sidewall of the metal line during metal etching. The integrity of the underlying tungsten plug is preserved.

While the invention has been particularly shown and described with reference to the preferred embodiments thereof, it will be understood by those skilled in the art that various changes in form and details may be made without departing from the spirit and scope of the invention.

What is claimed is:

1. An integrated circuit device comprising:
   semiconductor device structures in and on a semiconductor substrate having an insulating layer thereover;
   a tungsten plug extending through said insulating layer to contact one of said semiconductor device structures;
   a metal line stack overlying said tungsten plug wherein said metal line stack comprises:
      a barrier layer contacting said tungsten plug;
      a metal layer overlying said barrier layer;
      an antireflective coating layer overlying said metal layer; and
      a fluorine-doped silicate glass hard mask overlying said antireflective coating layer;
   a $C_xF_y$ passivation layer on sidewalls of said metal line stack; and
   a passivation layer overlying said metal line stack to complete said integrated circuit device.

2. The device according to claim 1 wherein said semiconductor device structures include gate electrodes and source and drain regions.

3. The device according to claim 1 wherein said barrier layer comprises titanium and titanium nitride with a combined thickness of between about 500 and 1500 Angstroms.

4. The device according to claim 1 wherein said metal layer comprises AlCu having a thickness of between about 4000 and 8000 Angstroms.

5. The device according to claim 1 wherein said antireflective coating layer comprises one of the group containing titanium, nitride, and oxynitride.

6. The device according to claim 1 wherein said fluorine-doped silicate glass hard mask has a thickness of between about 200 and 1200 Angstroms.

\* \* \* \* \*